(12) United States Patent
Song et al.

(10) Patent No.: US 11,670,576 B2
(45) Date of Patent: Jun. 6, 2023

(54) WIRING BOARD AND ELECTRONIC DEVICE MODULE

(71) Applicant: SAMSUNG ELECTRONICS CO., LTD., Suwon-si (KR)

(72) Inventors: Jongsup Song, Hwaseong-si (KR); Seolyoung Choi, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 292 days.

(21) Appl. No.: 17/060,248

(22) Filed: Oct. 1, 2020

(65) Prior Publication Data

US 2021/0242118 A1 Aug. 5, 2021

(30) Foreign Application Priority Data

Jan. 30, 2020 (KR) .................. 10-2020-0010939

(51) Int. Cl.
*H01L 23/498* (2006.01)
*H01L 25/16* (2023.01)
(Continued)

(52) U.S. Cl.
CPC ........ *H01L 23/49827* (2013.01); *H01L 23/13* (2013.01); *H01L 23/367* (2013.01);
(Continued)

(58) Field of Classification Search
CPC . H01L 23/49827; H01L 23/13; H01L 23/367; H01L 23/49838; H01L 24/32; H01L 24/73; H01L 25/165; H01L 25/167; H01L 2224/32227; H01L 2224/73265; H01L 24/16; H01L 24/48; H01L 24/49; H01L 2224/16225; H01L 2224/16245; H01L 2224/32245; H01L 2224/48091; H01L 2224/48247; H01L 2224/49171;
(Continued)

(56) References Cited

U.S. PATENT DOCUMENTS 6,372,608 B1 4/2002 Shimoda et al.
6,645,830 B2 11/2003 Shimoda et al.
(Continued)

*Primary Examiner* — Vu A Vu
(74) *Attorney, Agent, or Firm* — Sughrue Mion, PLLC

(57) ABSTRACT

A wiring board includes: a metal plate having first and second surfaces opposite to each other, and having at least one through-hole penetrating through the first and second surfaces; at least one conductive via respectively disposed in the through-hole and spaced apart from the metal plate; an insulating structure including at least one through-insulating portion disposed between the through-hole and the conductive via, and a first insulating layer and a second insulating layer extending from the through-insulating portion and disposed in first regions surrounding the conductive via, on the first surface and the second surface, respectively; at least one first upper pad disposed on the first insulating layer and electrically connected to the conductive via; at least one first lower pad disposed on the second insulating layer and electrically connected to the conductive via; a second upper pad disposed on the first surface of the metal plate; and a second lower pad disposed on the second surface of the metal plate and electrically connected to the first upper pad through the metal plate.

20 Claims, 14 Drawing Sheets

(51) Int. Cl.
  *H01L 23/00* (2006.01)
  *H01L 23/13* (2006.01)
  *H01L 23/367* (2006.01)
  *H05K 1/11* (2006.01)
  *H05K 1/18* (2006.01)
  *H01S 5/024* (2006.01)
  *H01S 5/0234* (2021.01)
  *H01S 5/02253* (2021.01)

(52) U.S. Cl.
  CPC ........ *H01L 23/49838* (2013.01); *H01L 24/32* (2013.01); *H01L 24/73* (2013.01); *H01L 25/165* (2013.01); *H01L 25/167* (2013.01); *H01S 5/0234* (2021.01); *H01S 5/02253* (2021.01); *H01S 5/02469* (2013.01); *H05K 1/112* (2013.01); *H05K 1/181* (2013.01); *H01L 2224/32227* (2013.01); *H01L 2224/73265* (2013.01)

(58) Field of Classification Search
  CPC . H01L 2224/49175; H01L 2224/73253; H01L 2224/92247; H01L 2924/00014; H01L 2924/12041; H01L 2924/12042; H01L 2924/12043; H01L 2924/14; H01L 2924/15174; H01L 2924/15192; H01L 23/142; H01L 23/49844; H01L 23/5385; H01L 25/16; H01L 25/18; H01L 23/528; H01L 23/04; H01L 23/29; H01L 23/481; H01L 23/485; H01L 25/0657; H01S 5/02253; H01S 5/0234; H01S 5/02469; H05K 1/112; H05K 1/181; H05K 2203/049; H05K 1/056; H05K 3/445; H05K 1/115; H05K 1/116; H05K 3/4038; H05K 1/0206; H05K 1/111
  USPC ...................................................... 372/44.01
  See application file for complete search history.

(56) References Cited

U.S. PATENT DOCUMENTS

| | | | |
|---|---|---|---|
| RE38,466 E | 3/2004 | Inoue et al. | |
| 6,753,205 B2 | 6/2004 | Halahan | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,812,360 B2 * | 10/2010 | Yano | H01L 33/641 257/E33.072 |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,236,618 B2 * | 8/2012 | Lin | H05K 1/0204 257/E23.102 |
| 8,236,619 B2 | 8/2012 | Lin et al. | |
| 8,263,987 B2 | 9/2012 | Choi et al. | |
| 8,310,045 B2 | 11/2012 | Son | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 9,013,031 B2 | 4/2015 | Im et al. | |
| 9,252,127 B1 | 2/2016 | Shen et al. | |
| 2011/0042699 A1 * | 2/2011 | Park | H01L 33/486 257/E33.059 |
| 2014/0041906 A1 * | 2/2014 | Kang | H05K 3/4038 29/852 |
| 2014/0159222 A1 | 6/2014 | Hong et al. | |
| 2016/0315072 A1 | 10/2016 | Keser et al. | |
| 2018/0130768 A1 | 5/2018 | Tan et al. | |

* cited by examiner

I-I'

I-I'

I-I'

I-I'

I-I'

III-III'

WIRING BOARD AND ELECTRONIC DEVICE MODULE

CROSS-REFERENCE TO THE RELATED APPLICATION(S)

This application is based on and claims priority from Korean Patent Application No. 10-2020-0010939 filed on Jan. 30, 2020 in the Korean Intellectual Property Office, the entire disclosure of which is incorporated herein by reference for all purposes.

BACKGROUND

The present disclosure relates to a wiring board and an electronic device module having the same.

In recent years, with the development of technologies related to electronic devices, high performance and high output of semiconductor devices have been developed. As the semiconductor device gains high-performance and high levels of power, problems related to heat generated in the semiconductor device may occur. Various studies have been conducted to address the problem of heat generated in a semiconductor device.

SUMMARY

Example embodiments are to provide a wiring board having improved heat dissipation performance.

Example embodiments are to provide an electronic device module having a wiring board with improved heat dissipation performance.

According to example embodiments, a wiring board includes: a metal plate having first and second surfaces opposite to each other, and having at least one through-hole penetrating through the first and second surfaces; at least one conductive via respectively disposed in the through-hole and spaced apart from the metal plate; an insulating structure including at least one through-insulating portion disposed between the through-hole and the conductive via, and a first insulating layer and a second insulating layer extending from the through-insulating portion and disposed in first regions surrounding the conductive via, on the first surface and the second surface, respectively; at least one first upper pad disposed on the first insulating layer and electrically connected to the conductive via; at least one first lower pad disposed on the second insulating layer and electrically connected to the conductive via; a second upper pad disposed on the first surface of the metal plate; and a second lower pad disposed on the second surface of the metal plate and electrically connected to the first upper pad through the metal plate.

According to example embodiments, an electronic device module includes a metal plate having first and second surfaces opposing each other, and having a plurality of through-holes penetrating through the first and second surfaces; a plurality of conductive vias disposed in the plurality of through-holes, respectively, and spaced apart from the metal plate; an insulating structure including a plurality of through-insulating portions disposed between the plurality of through-holes and the plurality of conductive vias, respectively, and a first insulating layer and a second insulating layer extending from the plurality of through-insulating portions and disposed in regions around the plurality of conductive vias, on the first surface and the second surface, respectively; a plurality of first upper pads disposed on the first insulating layer and connected to the plurality of conductive vias, respectively; a plurality of first lower pads disposed on the second insulating layer and connected to the plurality of conductive vias, respectively; a second upper pad disposed on the first surface of the metal plate; a second lower pad disposed on the second surface of the metal plate and electrically connected to the first upper pad by the metal plate; a first electronic device mounted on the second upper pad and electrically connected to the first and second upper pads, respectively; and a second electronic device mounted on the first upper pad and respectively, electrically connected to the first and second upper pads.

According to example embodiments, an electronic device module includes: the above wiring board; and a first electronic device mounted on the second upper pad and electrically connected to the first and second upper pads, respectively.

According to example embodiments, an electronic device includes: a lower package having a semiconductor chip; and an upper package including a wiring board disposed on the lower package, and first and second electronic devices disposed on the wiring board, wherein the lower package includes: a package substrate having a wiring circuit and provided with the semiconductor chip mounted thereon to be connected to the wiring circuit; a frame having a receiving portion accommodating the semiconductor chip; and a plurality of vertical connection conductors penetrating through an upper surface and a lower surface of the frame and electrically connected to the wiring circuit, wherein the wiring board of the upper package includes: a metal plate having a first surface facing the upper surface of the frame and a second surface opposite to the first surface, and having a plurality of through-holes penetrating through the first surface and the second surface; a plurality of conductive vias disposed in the through-holes, respectively, and spaced apart from the metal plate; an insulating structure including a plurality of through-insulating portions disposed between the through-holes and the conductive vias, respectively, and a first insulating layer and a second insulating layer extending from the through-insulating portions and disposed in first regions around the conductive vias on the first and second surfaces, respectively; a plurality of first upper pads and a plurality of first lower pads disposed on the first and second insulating layers, respectively, and electrically connected to the conductive vias, respectively; and a second upper pad and a second lower pad disposed on the first and second surfaces of the metal plate, respectively, and electrically connected to each other through the metal plate, and wherein the first and second electronic devices are mounted on at least one of the first upper pads and the second upper pad, respectively, and are electrically connected to the first upper pads and the second upper pad, and the first lower pads and the second lower pad are electrically connected to the vertical connection conductors, respectively.

According to example embodiments, a wiring board includes: a metal plate having first and second surfaces opposite to each other, each of the first and second surfaces being divided into first and second regions, wherein the first region has a lower level than the second region, and the metal plate comprises at least one through-hole penetrating through the first regions of the first and second surfaces; an insulating structure comprising at least one through-insulating portion disposed along a sidewall of the through-hole, a first insulating layer extending from the through-insulating portion to the first region of the first surface, and a second insulating layer extending from the through-insulating portion to the first region of the second surface; at least one conductive via penetrating through the insulating structure to be located in the through-hole and electrically insulated from the metal plate by the through-insulating portion; at least one first upper pad and at least one first lower pad disposed on the first insulating layer and the second insulating layer, respectively, and electrically connected to each other by the conductive via; and a second upper pad and a second lower pad disposed on the second region of the first surface and the second region of the second surface, respectively, and electrically connected to each other through the metal plate.

BRIEF DESCRIPTION OF DRAWINGS

The above and other aspects, features, and advantages of the present disclosure will be more clearly understood from the following detailed description, taken in conjunction with the accompanying drawings, in which:

FIGS. 3A to 8A are plan views for respective processes to illustrate a method of manufacturing a metal-based wiring board according to an example embodiment;

FIGS. 3B to 8B are cross-sectional views for respective processes to illustrate a method of manufacturing a metal-based wiring board according to an example embodiment;

DETAILED DESCRIPTION

Hereinafter, various example embodiments will be described in detail with reference to the accompanying drawings.

Figure 1A:
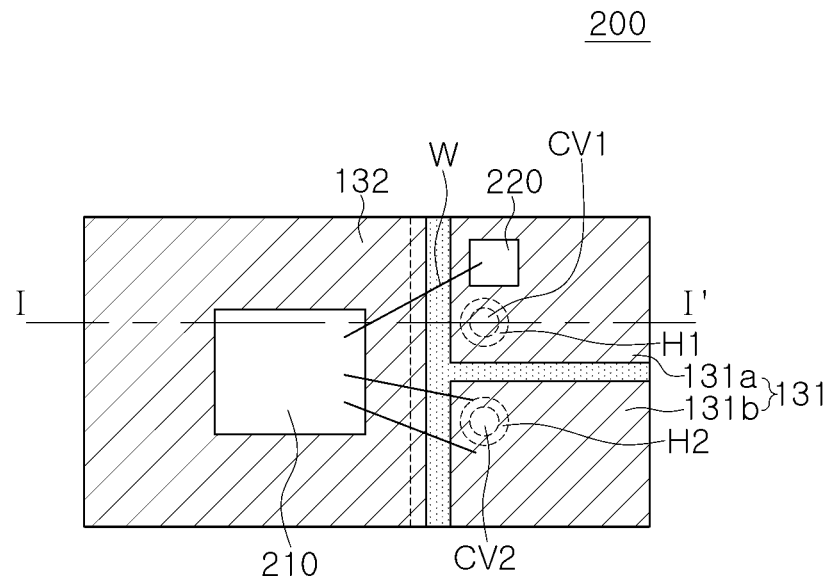
FIG. 1A is a plan view of an electronic device module, according to an example embodiment.
Figure 1B:
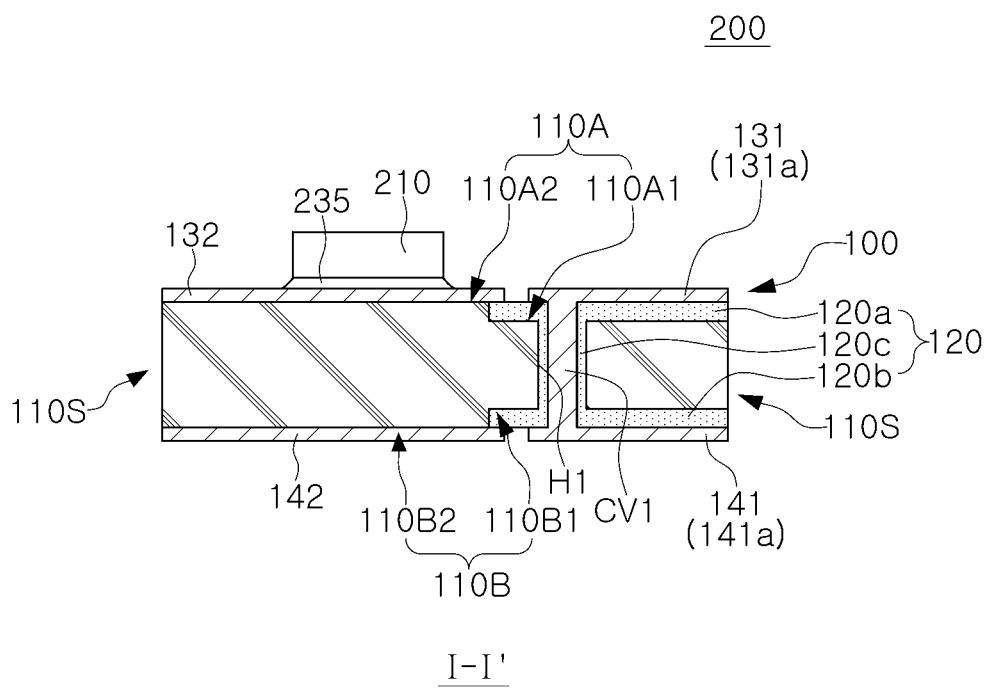
FIG. 1B is a side cross-sectional view of the electronic device module taken along line I-I' in FIG. 1A.

FIG. 1A is a plan view of an electronic device module according to an example embodiment, and FIG. 1B is a side cross-sectional view of the electronic device module taken along line I-I' illustrated in FIG. 1A.

Referring to FIGS. 1A and 1B, an electronic device module 200 according to an example embodiment includes a wiring board 100 and first and second electronic devices 210 and 220 mounted on the wiring board 100.

The wiring board 100 according to this embodiment may include a metal plate 110 having a first surface 110A and a second surface 110B opposite to each other, and a plurality of through-holes H1 and H2 penetrating through the first surface 110A and the second surface 110B. The metal plate 110 may include a metal or an alloy having high thermal conductivity and electrical conductivity. For example, the metal plate 110 may include copper (Cu), aluminum (Al), or an alloy.

The wiring board 100 includes a vertical wiring structure connecting upper and lower surfaces thereof, that is, the first and second surfaces 110A and 110B. As illustrated in FIG. 1B, such a vertical wiring structure may include a plurality of conductive vias CV1 and CV2 disposed in the through-holes H1 and H2, respectively. The conductive vias CV1 and CV2 may be electrically insulated from the metal plate 110 by an insulating structure 120.

The insulating structure 120 may include a plurality of through-insulating portions 120c each of which is disposed between the inner sidewalls of each of the through-holes H1 and H2 and each of the conductive vias CV1 and CV2, respectively. In addition, the insulating structure 120 may include a first insulating layer 120a and a second insulating layer 120b, which extend from each of the through-insulating portions 120c and disposed in regions around each of the conductive vias CV1 and CV2, for example, in first regions 110A1 and 110B1 on the first surface 110A and the second surface 110B, respectively.

In this embodiment, the conductive vias CV1 and CV2 are disposed side by side to be adjacent to one side edges, and the first and second insulating layers 120a and 120b are formed along the edges and may be respectively provided as a single layer on each of the first and second surfaces 110A and 110B. In addition, the through-insulating portions 120c positioned in the through-holes H1 and H2 may be formed of the same material as the first and second insulating layers 120a and 120b to be integrated therewith. For example, the insulating structure 120 may include an insulating resin (e.g., insulating ink) such as epoxy or polyimide.

As illustrated in FIG. 1B, in the metal plate 110 employed in this embodiment, regions in which the first and second insulating layers 120a and 120b are disposed may have a structure set to have a lower level than other regions. In detail, the first and second surfaces 110A and 110B of the metal plate 110 may be divided into first regions 110A1 and 110B1 and second regions 110A2 and 110B2, respectively. The first regions 110A1 and 110B1 are regions in which the first and second insulating layers 120a and 120b are disposed and may have a lower level than the second regions 110A2 and 110B2. The first regions 110A1 and 110B1 may be formed by etching corresponding areas of the metal plate 110.

The through-holes H1 and H2 may penetrate through the first region 110A1 of the first surface 110A and the first region 110B1 of the second surface 110B. In this embodiment, the first region 110A1 of the first surface 110A and the first region 110B1 of the second surface 110B are illustrated as being substantially overlapped in a vertical direction, but in another embodiment, some areas of the first regions 110A1 and 110B1 may not overlap in the vertical direction.

The areas where the first and second insulating layers 120a and 120b are formed may be defined by the first regions 110A1 and 110B1, and the first and second insulating layers 120a and 120b may provide regions in which a first upper pad 131a and a first lower pad 141a are to be formed. In detail, the through-holes H1 and H2 are located in the vertically overlapping areas of the first regions 110A1 and 110B1, and the other areas of the first regions 110A1 and 110B1 may be variously changed depending on a required design of the first upper pad 131a and the first lower pad 141a.

On the first surface 110A of the metal plate 110, the first insulating layer 120a disposed in the first region 110A1 is substantially coplanar with the surface of the second region 110A2. Similarly, on the second surface 110B of the metal plate 110, the second insulating layer 120B disposed in the first region 110B1 may have a surface substantially coplanar with the surface of the second region 110B2. However, the example embodiment is not limited thereto, and in some embodiments, the surfaces of the first and second insulating layers 120a and 120b may have a level different from the surfaces the second regions 110A2 and 110B2, respectively.

The wiring board 100 may include a plurality of first upper pads 131a and 131b connected to the conductive vias CV1 and CV2, respectively, on the first insulating layer 120a, and a plurality of first lower pads 141a and 141b connected to the conductive vias CV1 and CV2, respectively, on the second insulating layer 120b. In this embodiment, although the conductive vias CV1 and CV2 are illustrated in a form connected to one first upper pad 131a and one first lower pad 141a, respectively; one first upper pad or one first lower pad may also be connected to at least two conductive vias in other embodiments.

As such, together with the conductive vias CV1 and CV2, the first upper pads 131a and 131b and the first lower pads 141a and 141b may provide a plurality of vertical wiring structures electrically separated from the metal plate 110. As described above, these vertical wiring structures may be separated from the metal plate 110 by the insulating structure 120.

The wiring board 100 may include a second upper pad 132 disposed on the first surface 110A and a second lower pad 142 disposed on the second surface 110B. Unlike the first upper pad 131 and the first lower pad 141, the second upper pad 132 and the second lower pad 142 are directly connected to the metal plate 110, and may be electrically connected to each other through the metal plate 110, without a separate conductive via.

In this embodiment, a portion of the second upper pad 132 may be disposed on the first insulating layer 120a. Similarly, a portion of the second lower pad 142 may be disposed on the second insulating layer 120b.

The first and second upper pads 131 and 132 and the first and second lower pads 141 and 142 may be formed in a plating process. For example, the first and second upper pads 131 and 132 and the first and second lower pads 141 and 422 may respectively include a seed layer (e.g., a Ni, Cr, Ti or a combination layer thereof), and a plating layer formed on the seed layer (e.g., a Cu layer). Similarly, the conductive vias CV1 and CV2 may also be formed in a plating process. The conductive vias CV1 and CV2 may be formed by the same plating process, together with the formation of the first and second upper pads 131 and 132 and the first and second lower pads 141 and 422 (see FIGS. 7A and 7B). In this embodiment, the conductive vias CV1 and CV2 are illustrated in a fill type formed by plating, but may also have a form in which a plating layer having a predetermined thickness is formed along the inner sidewall of the through-insulating portion 120c and the inside thereof has an empty space or the empty space is filled with another insulating material.

As illustrated in FIG. 1A, at least one edge of the first upper pad 131 and at least one edge of the second upper pad 132 may be disposed adjacent to one edge of the first surface 110A. Similarly, at least one edge of the first lower pad 141 and at least one edge of the second lower pad 142 may be disposed adjacent to one edge of the second surface 110B. This arrangement of the pads may be understood as a result of forming a plating layer for at least a portion of the pads over a plurality of adjacent wiring boards in the manufacturing process of the wiring board, and separating the plating layers in the process of cutting to individual wiring boards.

In this embodiment, the first and second electronic devices 210 and 220 may be mounted on the first and second upper pads 131 and 132. In this embodiment, the first electronic device 210 is disposed on the second upper pad 132, and the second electronic device 220 may be disposed on the first upper pad 131.

The first and second electronic devices 210 and 220 may be electrically connected to at least one of the first and second upper pads 131 and 132 or another electronic device 220 or 210 by a surface mounting method or a wire method. In this embodiment, the first and second electronic devices 210 and 220 may be devices having a structure having an upper surface on which a first electrode is disposed and a lower surface on which a second electrode is disposed. In the case of the first and second electronic devices 210 and 220, the second electrodes may be connected to the second upper pad 132 and the first upper pad 131, respectively, by using the surface-mounting method. For example, as illustrated in FIG. 1B, the second electrode of the first electronic device 210 is electrically, mechanically, and thermally connected to the second upper pad 132 by a conductive bonding layer 235. For example, the conductive bonding layer 235 may be a paste containing a metal such as Ag or Cu. The second electronic device 220 may be connected to the first upper pad 131a using a conductive bonding layer (not illustrated) similarly to the first electronic device 210.

The first electronic device 210 may be provided with a plurality of first electrodes thereon, and one of the first electrodes of the first electronic device 210 may be connected to a first electrode of the second electronic device 220 disposed on one first upper pad 131a by a wire W, and another one of the first electrodes of the first electronic device 210 may be connected to the other first upper pad 131b by another wire W.

The first electronic device 210 may be a main heat generating source having a larger heat generation amount than that of the second electronic device 220. The heat generated from the first electronic device 210 may be effectively dissipated through the metal plate 110 directly contacting the second upper pad 132.

Figure 2:
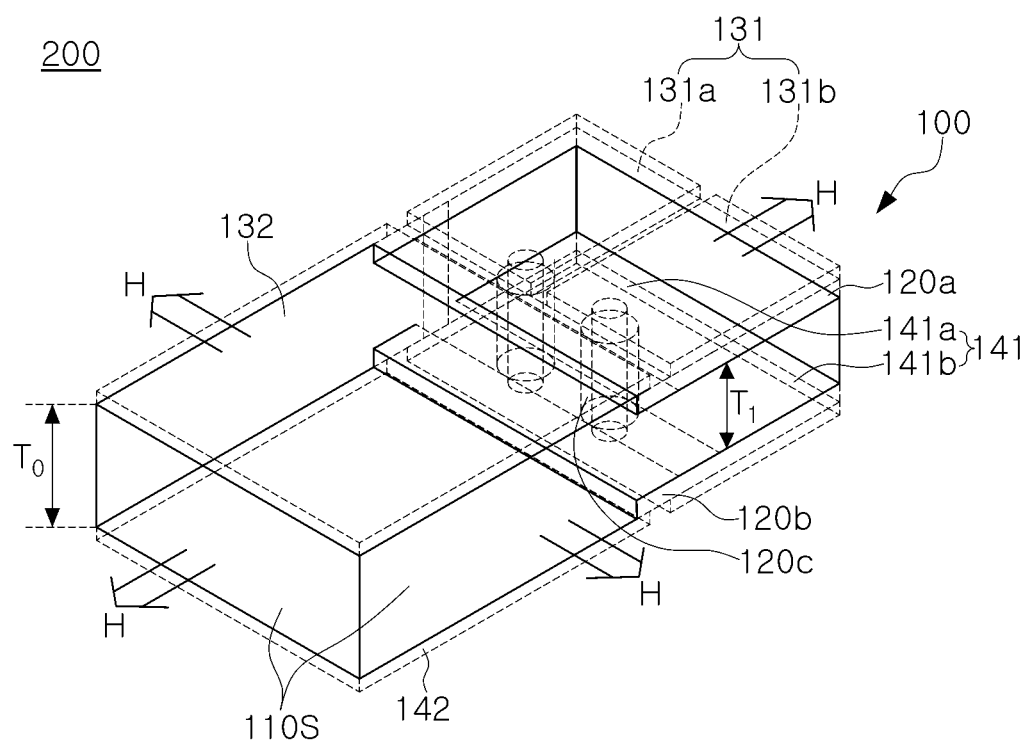
FIG. 2 is a perspective view of a metal-based wiring board according to an example embodiment.

All sides of the wiring board 100 according to this embodiment may be provided by side surfaces 110S of the metal plate, as illustrated in FIG. 2. FIG. 2 is a perspective view of a wiring board according to an example embodiment.

Referring to FIG. 2, the wiring board 100 has four sides, and four side surfaces 110S of the metal plate 110 may be continuously exposed to the four sides of the wiring board 100. Accordingly, heat generated from the first electronic device 210 is transferred to the metal plate 110 through the second upper pad 132 and may be effectively released through the side surfaces 110S (see Arrows "H"). A thickness $T_1$ of the continuously exposed portion of the metal plate 110 may be at least 50% of a total thickness $T_0$ of the metal plate 110.

In some embodiments, the total thickness $T_0$ of the metal plate 110 may be 800 μm or more, and an effective heat dissipation function may be performed by designing the thickness $T_1$ of the exposed portion of the metal plate to be greater than or equal to 70% and less than 100% of the thickness $T_0$.

For example, the first electronic device 210 may be a memory chip, a logic chip, or a high power light source device. For example, the memory chip may be a volatile memory chip such as a dynamic random access memory (DRAM) (e.g., a high bandwidth memory (HBM)) or a static random access memory (SRAM), or a non-volatile memory chip such as a phase-change random access memory (PRAM), a magnetoresistive random access memory (MRAM), a ferroelectric random access memory (FeRAM), or a resistive random access memory (RRAM). Further, the logic chip may be, for example, a microprocessor, an analog device, or a digital signal processor. Further, the high power light source device may be a high power light emitting diode or a high power laser diode. The second electronic device 220 may be a device having a relatively small amount of heat. For example, the second electronic device 220 may include a passive device such as a photodiode or a capacitor. In a specific embodiment, the first electronic device 210 is a high power light emitting diode or a high power laser diode, and the second electronic device 220 may be a photo diode.

FIGS. 3A to 8A are plan views for respective processes to illustrate a method of manufacturing the wiring board 100 illustrated in FIG. 2, and FIGS. 3B to 8B are cross-sectional views illustrating processes for the method of manufacturing the wiring board 100 illustrated in FIG. 2.

Figure 3A:
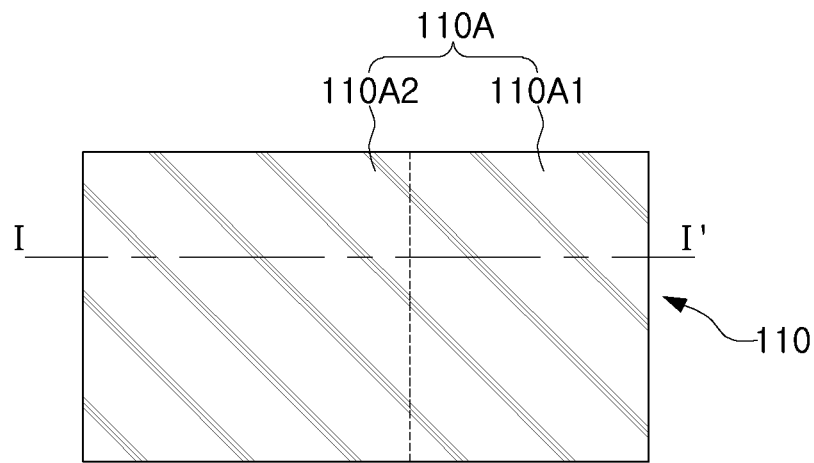
Figure 3B:
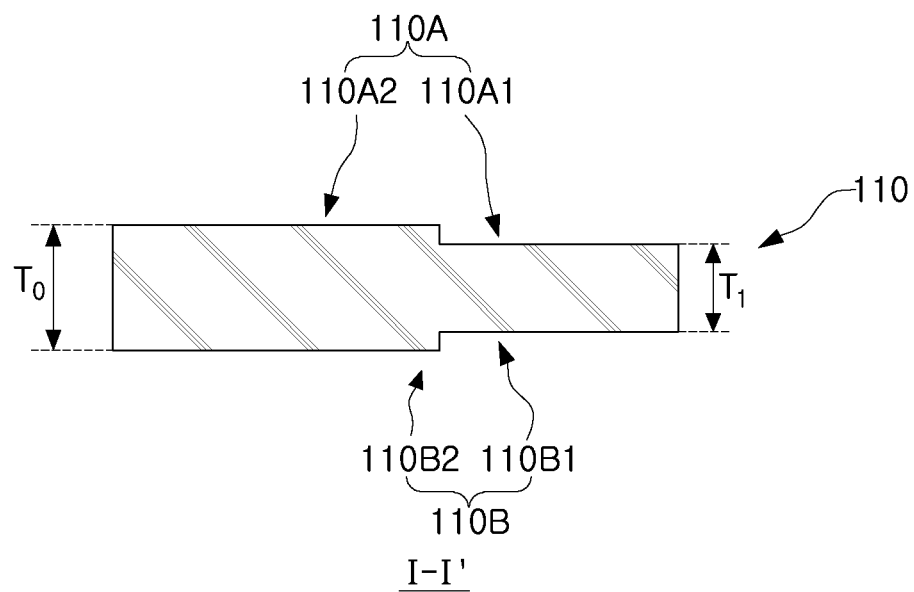

Referring to FIGS. 3A and 3B, the first regions 110A1 and 110B1 having a lower level than the second regions 110A2 and 110B2 are formed on the first and second surfaces 110A and 110B of the metal plate 110.

The metal plate 110 may include a metal or an alloy having high thermal conductivity and excellent electrical conductivity. For example, the metal plate 110 may be formed of copper (Cu), aluminum (Al), or an alloy thereof. For example, copper not only has excellent conductivity, but also has excellent thermal conductivity than ceramic, for example, about 300 W/mK, and thus may be advantageously used.

This process may be performed by a selective etching process with respect to the areas of the metal plate 110 on which the first and second insulating layers 120a and 120b (see FIGS. 5A and 5B) are to be disposed. The thicknesses of the first and second insulating layers 120a and 120b may be defined by depths etched on the first and second surfaces 110A and 110B. From the viewpoint of heat dissipation, it may be advantageous that the second region 110A2 having the thickness $T_0$ has a relatively large area than the second region 110A1 having the thickness $T_1$ after the etching. Further, the thickness $T_1$ of the etched portion of the metal plate 110 may be 50% or more, in detail, 70% or more, of the total thickness $T_0$ of the metal plate 110. In some embodiments, the total thickness $T_0$ of the metal plate 110 may be 800 µm or more, and the thickness $T_1$ of the exposed portion of the metal plate 110 may be 600 µm or more. In this embodiment, only one first regions 110A1 and 110B1 are provided on the first and second surfaces 110A and 110B, but a plurality of separate first and second regions may be provided on the first and second surfaces 110A and 110B (see FIGS. 9A to 9C).

Figure 4A:
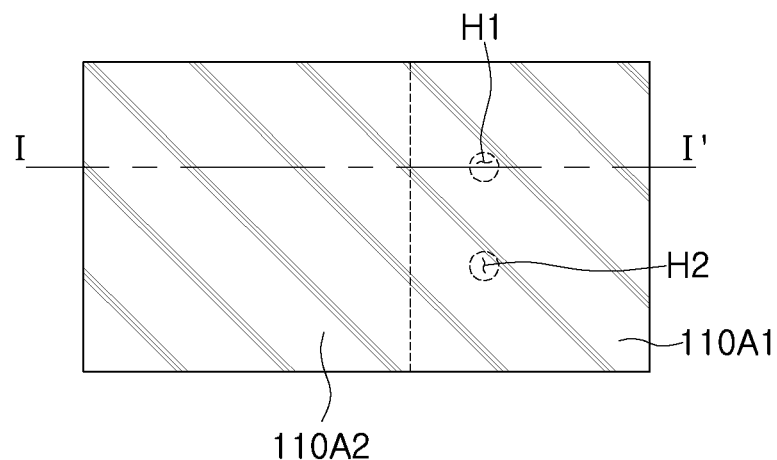
Figure 4B:
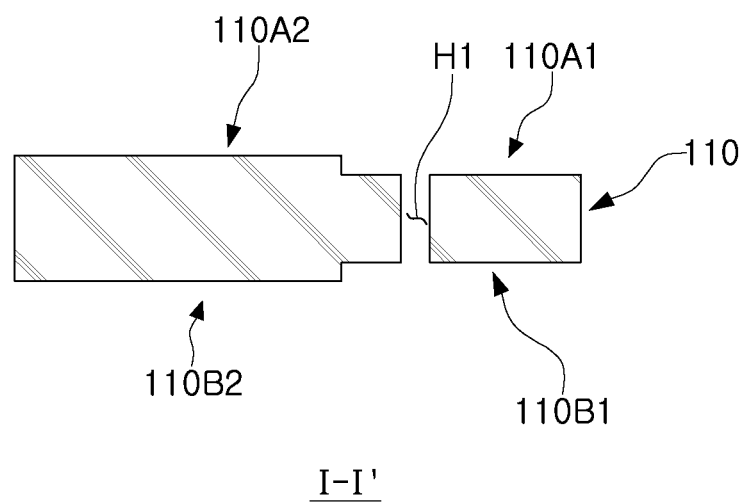

Next, referring to FIGS. 4A and 4B, a plurality of through-holes H1 and H2 penetrating through the first region 110A1 of the first surface 110A and the first region 110B1 of the second surface 110B.

The through-holes H1 and H2 may be formed using laser drilling or mechanical drilling. The through-holes H1 and H2 may be provided as vertical connection structures for connecting the first surface 110A and the second surface 110B. In this embodiment, two through-holes are formed, but in another embodiment, one through-hole or three or more through-holes may be formed.

Figure 5A:
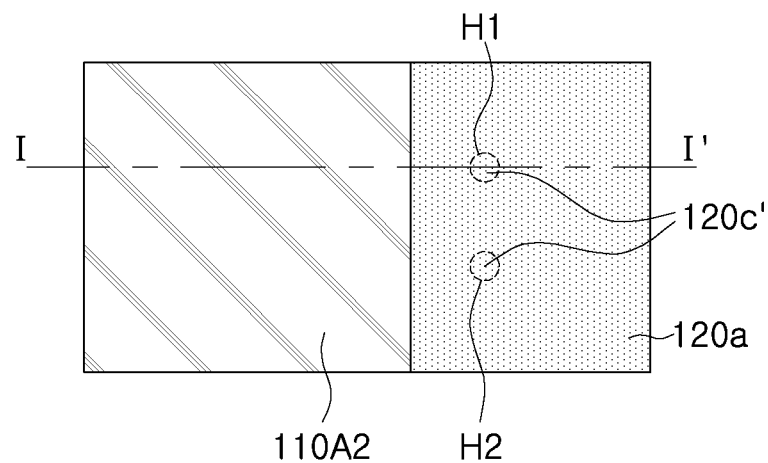
Figure 5B:
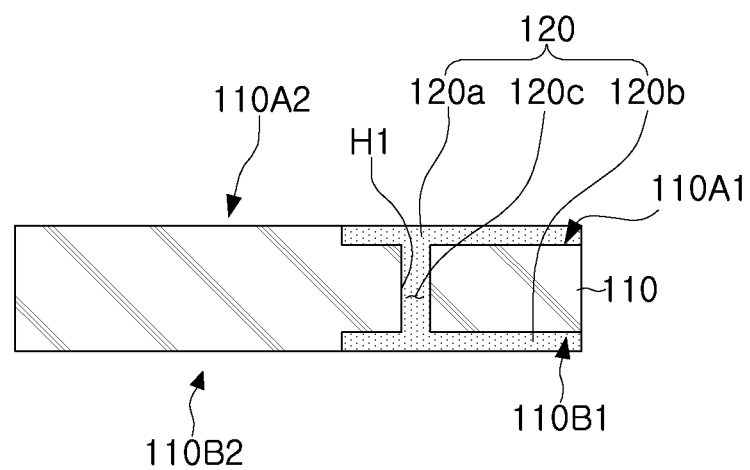

Next, referring to FIGS. 5A and 5B, an insulating structure 120 is formed on the first regions 110A1 and 110B1 so that the through-holes H1 and H2 are filled.

The insulating structure 120 may be formed using an insulating resin such as epoxy or polyimide (e.g., insulating ink), but the material used to form the insulating structure 120 is not limited thereto. The insulating structure 120 may be formed to be flat while filling the through-holes H1 and H2. After forming an insulating material layer to cover the first and second surfaces 110A and 110B, a polishing or etch-back process is performed on the insulating material layer to expose the second regions 110A2 and 110B2. Thus, first and second insulating layers 120a and 120b respectively defined by the first regions 110A1 and 110B1 may be formed.

As described above, the insulating structure 120 may include a plurality of through-insulating portions 120c filling the interiors of the through-holes H1 and H2, and the first and second insulating layers 120a and 120b extending from the through-insulating portions 120c and disposed on the first regions 110A1 and 110B1 of the first and second surfaces 110A and 110B, respectively.

Figure 6A:
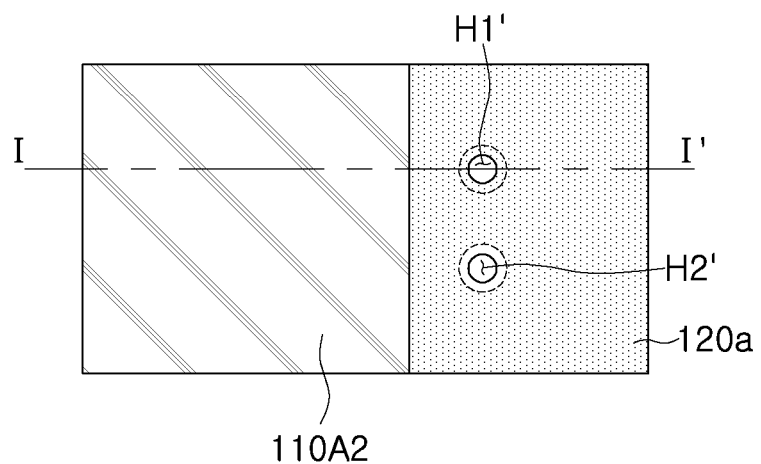
Figure 6B:
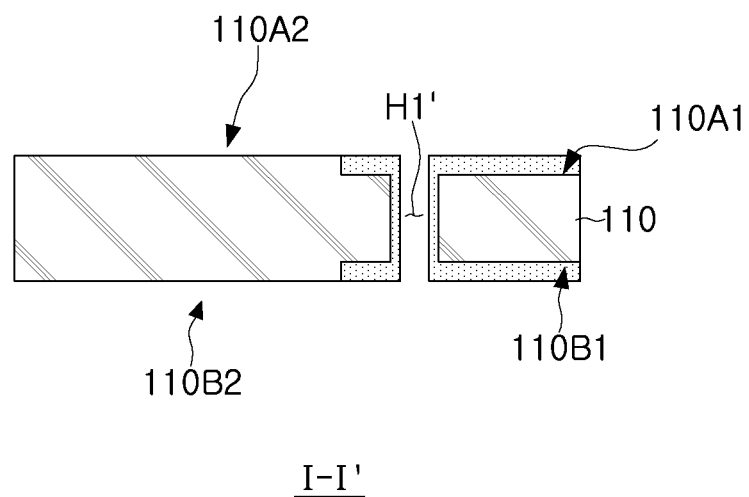

Subsequently, referring to FIGS. 6A and 6B, a plurality of contact holes H1' and H2' are formed in the through-insulating portions 120c of the insulating structures 120.

The contact holes H1' and H2' may be formed using laser drilling or mechanical drilling. The contact holes H1' and H2' have a smaller diameter than the through-holes H1 and H2, and may be formed in the through-insulating portions 120c. In detail, the contact holes H1' and H2' may be surrounded by the through-insulating portions 120c in such a manner that the inner sidewalls of the through-holes H1 and H2 (e.g., the surface of the metal plate 110) are not exposed.

Figure 7A:
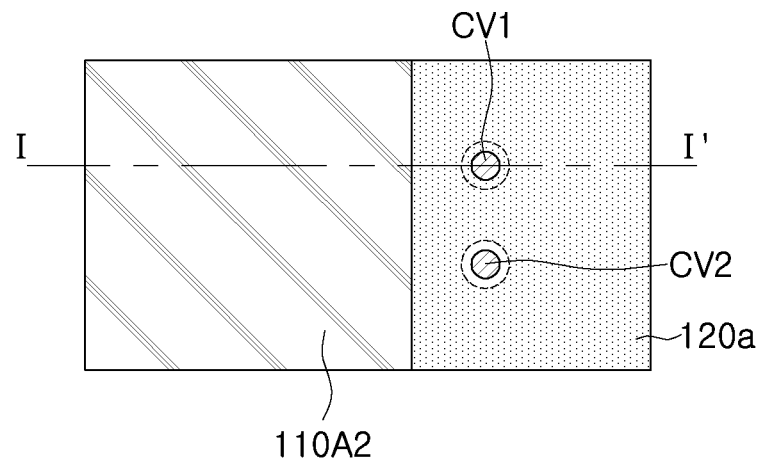
Figure 7B:
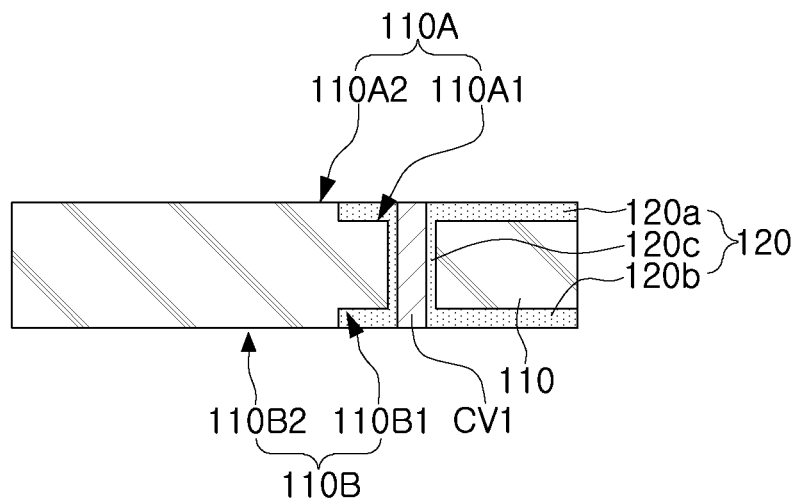

Next, referring to FIGS. 7A and 7B, a plurality of conductive vias CV1 and CV2 may be formed by filling the contact holes H1' and H2' with a conductive material.

For example, the conductive vias CV1 and CV2 may be formed by filling the contact holes H1' and H2' with a conductive material such as copper or silver paste. The conductive vias CV1 and CV2 may be provided as vertical connection structures connecting the first regions 110A1 and 110B1 of the first and second surfaces 110A and 110B. In some embodiments, the conductive vias CV1 and CV2 may include a material different from the metal plate 110.

Figure 8A:
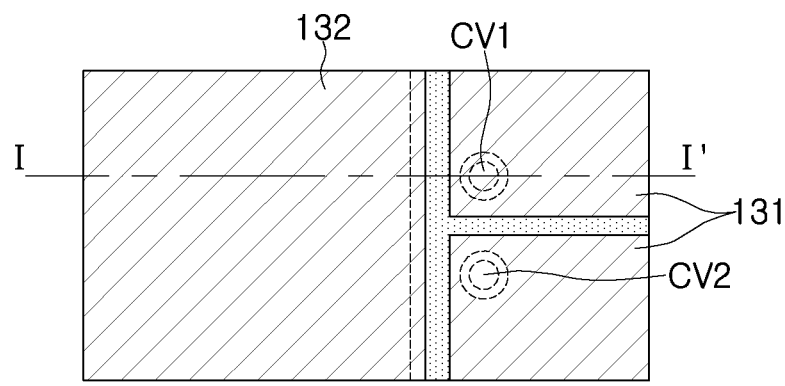
Figure 8B:
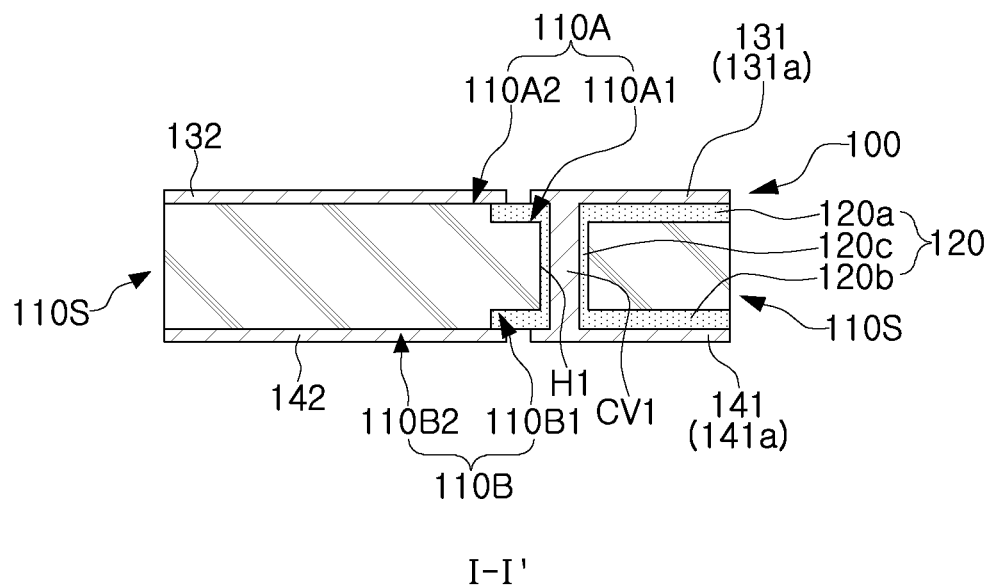

Referring to FIGS. 8A and 8B, first and second upper pads 131 and 132 and first and second lower pads 141 and 142 may be formed on the first and second surfaces 110A and 110B of the metal plate 110, respectively.

For example, the first and second upper pads 131 and 132 and the first and second lower pads 141 and 142 may be formed using a plating process. After forming a seed layer (formed of, for example, Ni, Cr, Ti or a combination thereof) on the first and second surfaces 110A and 110B, a photoresist exposing a pad formation region is formed on the seed layer (not illustrated), and a plating layer (formed of, e.g., Cu) is formed using a plating process, thereby forming required first and second upper pads 131 and 132 and first and second lower pads 141 and 142. The wiring board illustrated in FIGS. 8A and 8B may be manufactured, by removing the exposed seed layer together with the photoresist after the plating process.

Although this embodiment illustrates that the conductive vias CV1 and CV2 are formed by a process different from that of the first and second upper pads 131 and 132 and the first and second lower pads 141 and 142, the conductive vias CV1 and CV2 may be formed using the same plating. For example, the seed layer is also formed on the inner sidewalls of the contact holes H1' and H2' to form a required plating layer in the contact holes H1' and H2', thereby forming the conductive vias CV1 and CV2 together with the first and second upper pads 131 and 132 and the first and second lower pads 141 and 142. In this case, unlike the conductive vias CV1 and CV2 of the fill type illustrated in FIG. 8B, the conductive vias CV1 and CV2 have an empty space therein or an empty space may be filled with another insulating material depending on the thickness of the plating layer by plating.

Figure 9A:
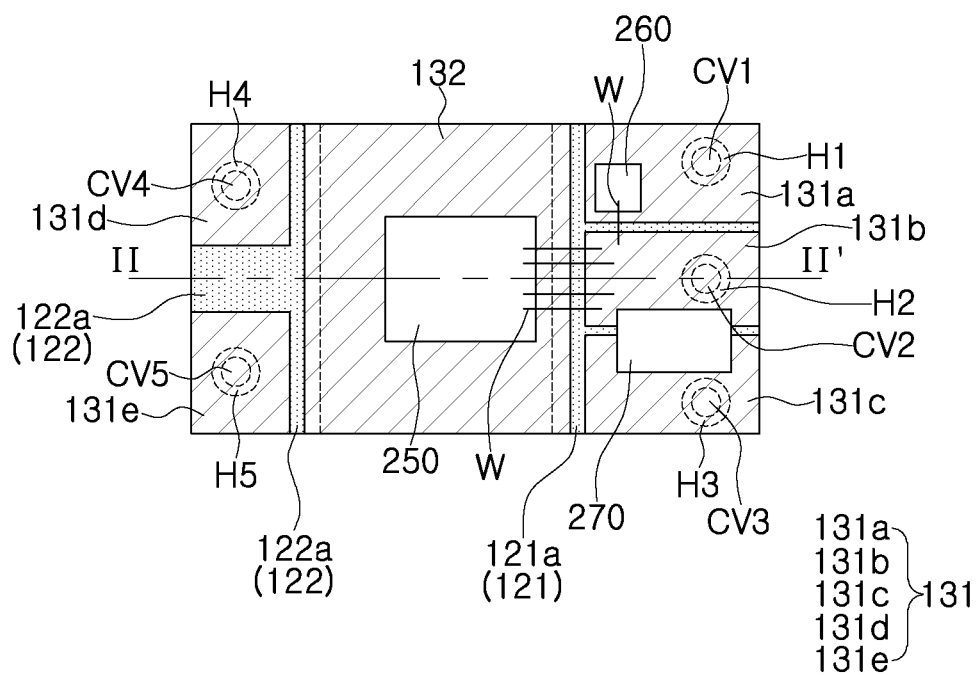
FIGS. 9A and 9B are plan and bottom views, respectively, of an electronic device module according to an example embodiment.
Figure 9B:
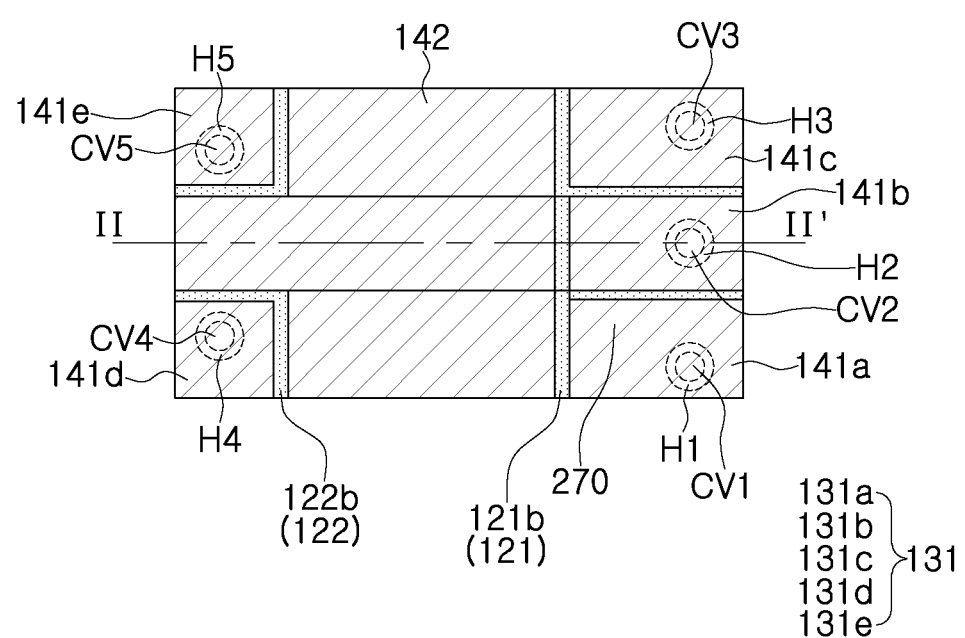
Figure 9C:
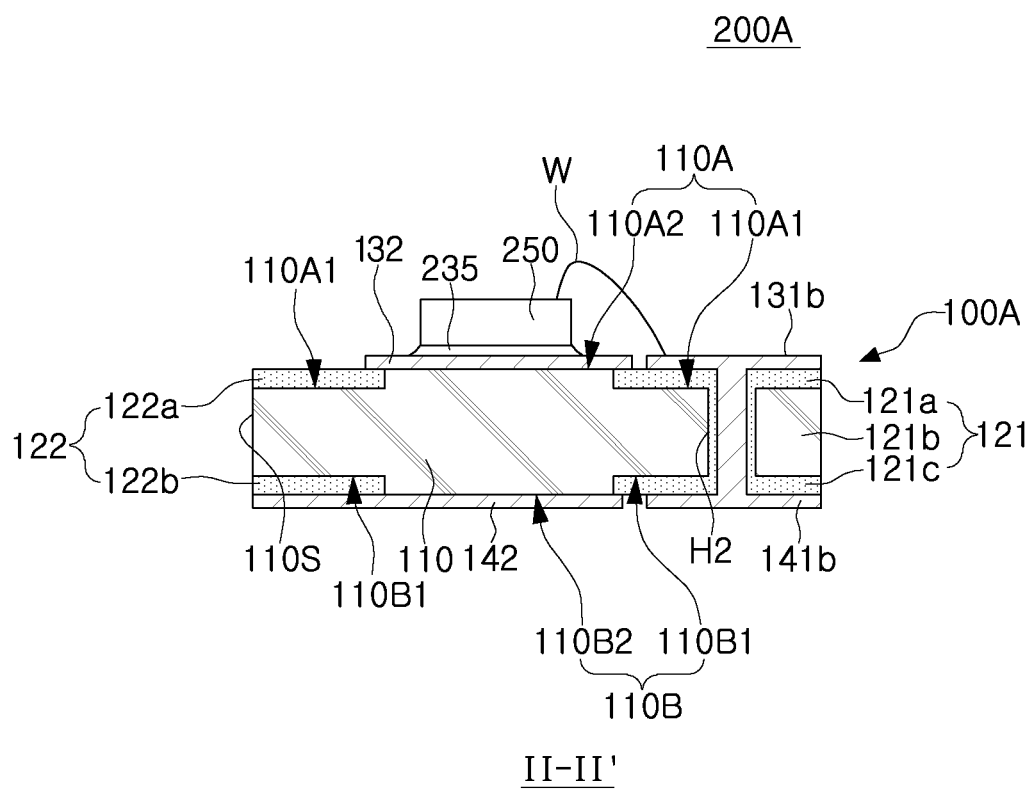
FIG. 9C is a side cross-sectional view of the electronic device module taken along line II-IF in FIG. 9A.

FIGS. 9A and 9B are plan and bottom views of an electronic device module according to an example embodiment, and FIG. 9C is a side cross-sectional view of the electronic device module illustrated in FIG. 9A (or FIG. 9B), taken along line II-IF.

Referring to FIGS. 9A to 9C, an electronic device module 200A according to an example embodiment may have a structure similar to that of the example embodiments illustrated in FIGS. 1A and 1B, except that the first regions 110A1 and 110B1 having a relatively low level are respectively provided as two separate areas on the first surface 110A and the second surface 110B, six vertical connecting structures (a metal plate 110, and five contact conductive vias CV1-CV5) are provided, and three electronic devices 250, 260 and 270 are provided. Accordingly, the descriptions of the embodiments illustrated in FIGS. 1A and 1B may be combined with the descriptions of this embodiment, unless specifically stated otherwise.

The electronic device module 200A according to this embodiment has a wiring board 100A different from the wiring board 100 employed in the foregoing embodiment. The wiring board 100A has two first regions 110A1 and 110B1 on each of the first and second surfaces 110A and 110B. In detail, the first regions 110A1 and 110B1 are respectively disposed on opposite edge portions of the first and second surfaces 110A and 110B of the metal plate 110.

First and second insulating structures may be disposed in the first regions 110A1 and 110B1 on both sides, respectively. In this embodiment, three through-holes H1, H2, and H3 are disposed in the first regions 110A1 and 110B1 on the right side, and two through-holes H4 and H5 are disposed in the first regions 110A1 and 110B1 on the left side.

The first insulating structure 121 may include three first through-insulating portions 121c disposed between inner sidewalls of the first to third through holes H1, H2 and H3 and the first to third conductive vias CV1, CV2 and CV3, respectively, and a first insulating layer 121a and a second insulating layer 121b extending from the first through-insulating portions 121c and disposed on the first regions 110A1 and 110B1 in which the first to third conductive vias CV1, CV2 and CV3 are located. Similarly, the second insulating structure 122 may include two second through-insulating portions 122c (not shown) disposed between inner sidewalls of the fourth and fifth through-holes H4 and H5 and the fourth and fifth conductive vias CV4 and CV5, respectively, and a first insulating layer 122a and a second insulating layer 122b extending from the second through-insulating portions 122c and disposed on the first regions 110Aa and 110B1 in which the fourth to fifth conductive vias CV4 and CV5 are located.

The electronic device module 200A according to this embodiment may be a light source module employed in an electronic device such as a mobile communication terminal, as in a 3D sensing module.

A first electronic device 250 may be a high power light emitting diode or a high power laser diode as a main heat source. For example, the first electronic device 250 may include a high power (e.g., 5 W or more) vertical cavity surface emitting laser (VCSEL). For example, second and third electronic devices 260 and 270 may be a photo diode chip and a zener diode chip, respectively.

The first electronic device 250 may be disposed on a second upper pad 132. The second upper pad 132 may provide another vertical connection structure together with the metal plate 110 and a second lower pad 142. In addition, heat generated from the first electronic device 250 may be effectively dissipated through the metal plate 110 directly contacting the second upper pad 132.

The electronic device module 200A illustrated in FIGS. 9A to 9C may be implemented as a PoP package in a stacked form with other functional packages such as a driving device, by including a vertical connection structure having upper and lower surfaces connected to each other. This embodiment is illustrated in FIGS. 10 to 12.

Figure 10:
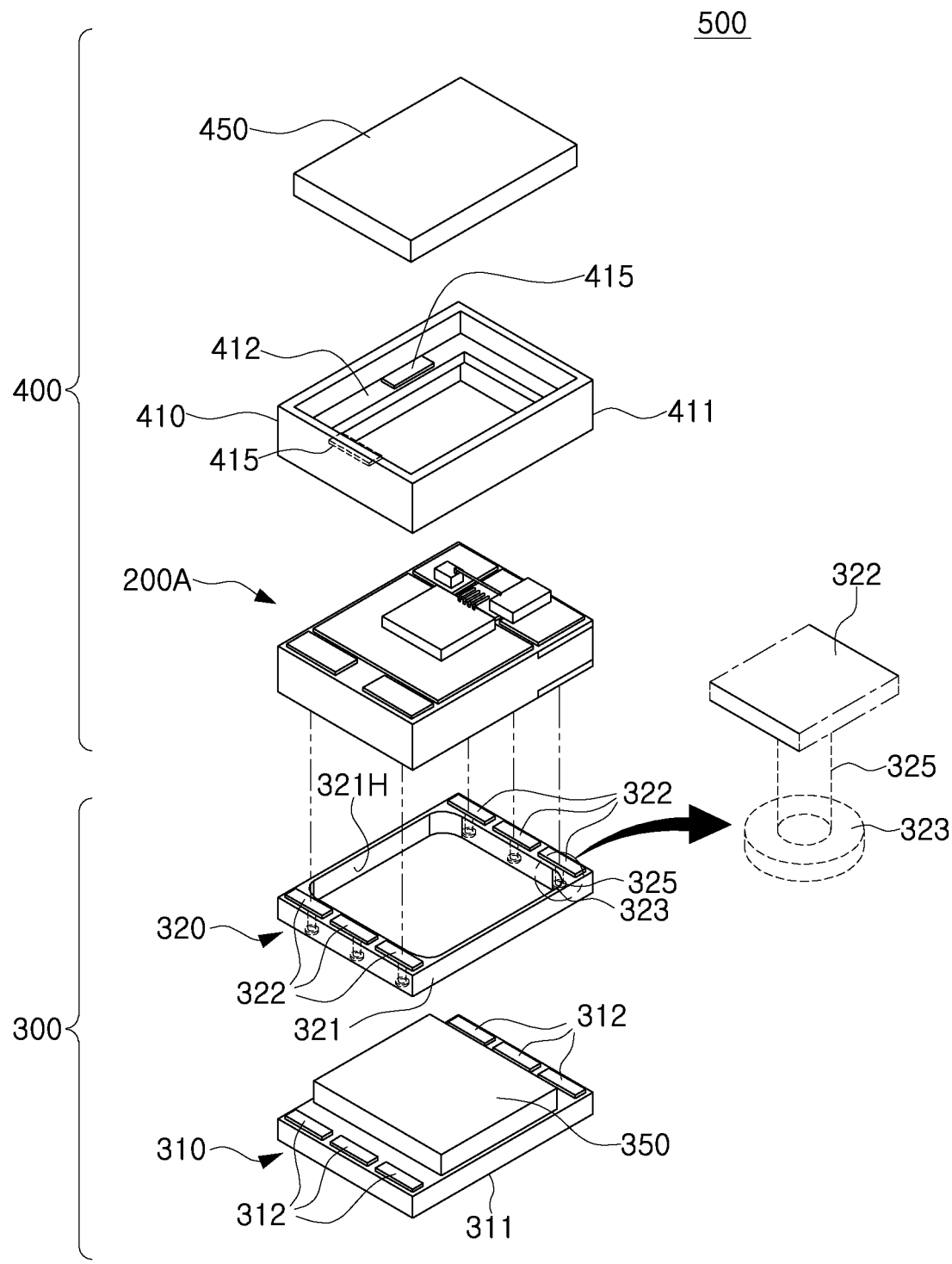
FIG. 10 is a schematic perspective view illustrating a POP-type electronic device module according to an example embodiment.
Figure 11:
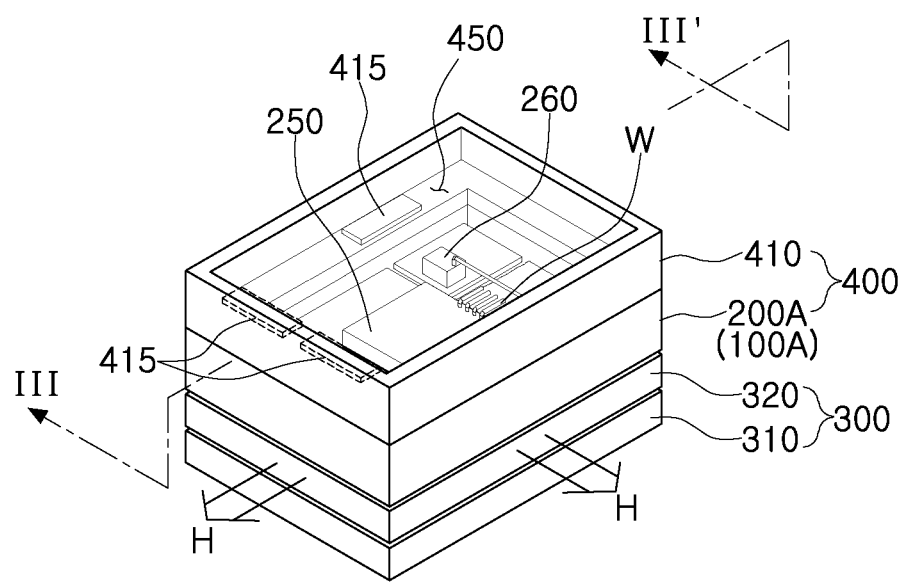
FIG. 11 is an exploded perspective view illustrating the POP-type electronic device module illustrated in FIG. 10.
Figure 12:
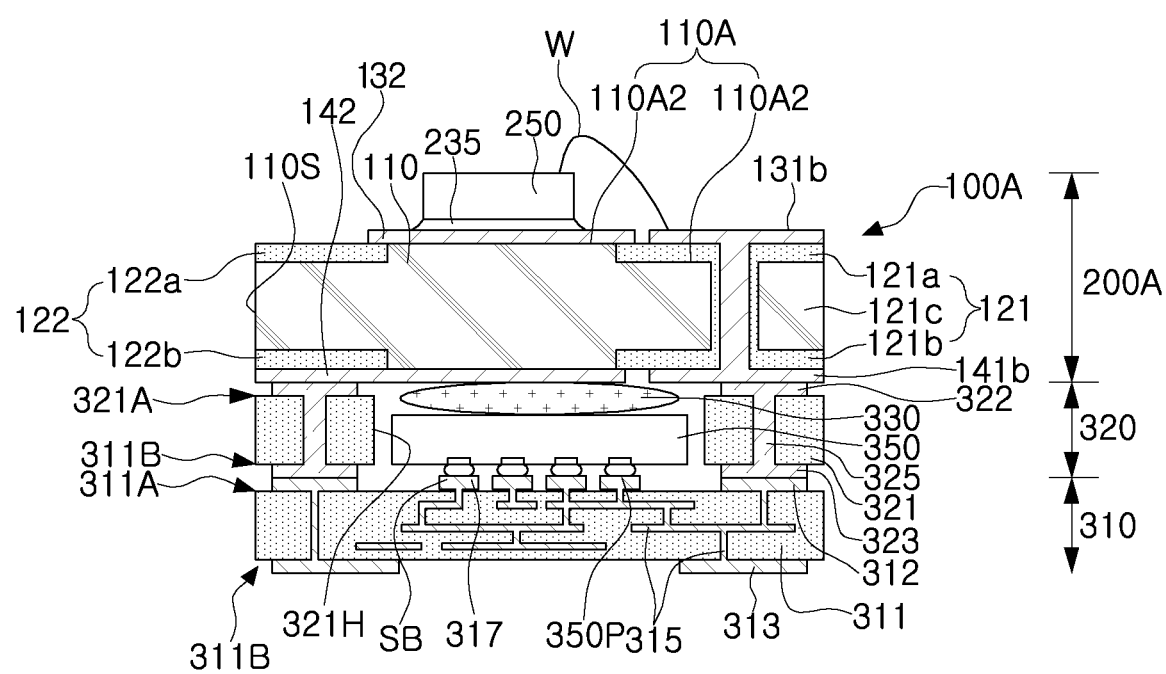
FIG. 12 is a cross-sectional view of the POP-type electronic device module (excluding the lens and housing) taken along line in FIG. 10.

FIG. 10 is a schematic perspective view illustrating a POP-type electronic device module according to an example embodiment, and FIG. 11 is an exploded perspective view illustrating the POP-type electronic device module illustrated in FIG. 10.

Referring to FIGS. 10 and 11, a POP-type electronic device module 500 according to an example embodiment includes a lower package 300 having a semiconductor chip 350 and an upper package 400 disposed on the lower package 300.

The upper package 400 may include the electronic device module 200A illustrated in FIG. 9A. For example, the upper package 400 may include a wiring board 100A, and first to third electronic devices 250, 260 and 270 disposed on the wiring board 100A. The upper package 400 may further include a lens housing 410 disposed on the wiring board 100A and having a window W open upwardly, and a lens unit 450 disposed in the window W.

The lower package 300 may include a package substrate 310 on which the semiconductor chip 350 is mounted, and a frame 320 disposed on the package substrate 310 and having a receiving portion 321H accommodating the semiconductor chip 350. The semiconductor chip 350 may be, for example, a driving integrated circuit (IC) chip.

Referring to FIG. 12, an electrical connection structure of the electronic device module 200A of the upper package 400 and the lower package 300 will be described in detail. FIG. 12 is a cross-sectional view of the POP-type electronic device module (excluding the lens and the housing) taken along line illustrated in FIG. 11, and may be understood as a cross-section view without the lens unit 450 and the lens housing 410 for convenience of descriptions.

Referring to FIG. 12, the package substrate 310 may include a substrate body 311 and a wiring circuit 315 formed in the substrate body 311. The frame 320 may include vertical connection conductors 322, 323 and 325 connected to the wiring circuit 315.

In detail, the package substrate 310 may include a bonding pad 317 disposed on an upper surface of the substrate body 311 and connected to the wiring circuit 315. The semiconductor chip 350 may be bonded to the package substrate 310 using a flip chip method. For example, a contact pad 350P of the semiconductor chip 350 may be connected to the bonding pad 317 using a conductive bump SB.

In addition, the package substrate 310 may include an upper pad 312 and a lower pad 313 disposed on an upper surface 311A and a lower surface 311B of the substrate body 311 and connected to the wiring circuit 315. The vertical connection conductor of the frame 320 includes an upper pattern 322 and a lower pattern 323 disposed on the upper surface 321A and the lower surface 321B of the frame body 321, respectively, and a through-via 325 penetrating through the frame body 321 to connect the upper and lower patterns 322 and 323.

The lower pattern 323 of the frame 320 is respectively connected to the upper pad 312 of the package substrate 310 and may be electrically connected to the semiconductor chip 350 through the wiring circuit 315.

In addition, the upper pattern 322 of the frame 320 may be connected to the lower pattern 323 by the through-via 325, and may be respectively and electrically connected to first lower pads 141a, 141b, 141c, 141d and 141e of the wiring board 110A and a second lower pad 142. The first lower pads 141a, 141b, 141c, 141d and 141e and the second lower pad 142 of the wiring board 100 may be arranged in positions corresponding to the upper pattern 322 of the frame 320 on both edge portions, as illustrated in FIG. 9B.

As such, the wiring board 110A may be electrically connected to the semiconductor chip 350 on the package substrate 310 through the vertical connection conductors 322, 323 and 325 of the frame 320, and through such an electrical connection path, the first to third electronic devices 250, 260 and 270 may transmit and receive electrical signals to and from the semiconductor chip 350.

For example, when the first to third electronic devices 250, 260 and 270 are optical elements such as a VCSEL chip or a photodiode chip constituting a light source module, these optical elements are driven by the semiconductor chip 350, which is a driving IC chip.

In this embodiment, heat generated from the first electronic device 250, which is a main heat source (e.g., VCSEL), may be effectively dissipated through the metal plate 110 directly contacting the second upper pad 132.

Referring to FIG. 11, the wiring board 100A has four side surfaces, and may be configured in such a manner that four side surfaces 110S of the metal plate 110 are continuously exposed to the four side surfaces of the wiring board 100A. Therefore, heat generated from the first electronic device 250 is transferred to the metal plate 110 through the second upper pad 132 and may be effectively discharged through the side surfaces 110S (see an "H" arrow).

On the other hand, in the PoP-type electronic device module 500, even in the case in which the first electronic device 250, which is a high heat source, is used, a separate heat spreader may be omitted by employing the wiring board 100A. In addition, a module having a PoP structure may be implemented together with a driving IC chip package (e.g., the lower package 300), using a vertical connection structure in which the upper and lower surfaces of the wiring board 100A are conducted. As described above, the PoP-type electronic device module 500 may improve heat dissipation performance and downsize the product.

A compact PoP structure may be implemented by implementing the upper package 400 and the lower package 300 to have the same size in plan view. As illustrated in FIGS. 10 and 11, side surfaces of the lower package 300 may be substantially coplanar with the side surfaces of the upper package 400, respectively.

In addition, in a case in which a high power laser diode such as a VECSEL (e.g., the first electronic device 250) is used, and if the lens unit 450 is damaged, the human eye may be damaged by high power light. Therefore, a lens damage sensing electrode 415 connected to the lens unit 450 may be disposed in the lens housing 410. A transparent electrode line (not illustrated) provided in advance in the lens unit 450 is connected to the lens damage sensing electrode 415, and the lens damage sensing electrode 415 is electrically connected to at least one or more of a plurality of first upper pads 131d and 131e of located below the lens housing 410, and may thus be connected to the semiconductor chip 250, which is a driving IC chip, through a circuit connection of the wiring board 100A, the frame 320 and the package substrate 310. Accordingly, when damage to the transparent electrode line is detected, information is transferred to the semiconductor chip 250 and driving of the high-power laser diode (e.g., the first electronic device 250) may be stopped.

In this embodiment, the upper surface of the semiconductor chip 250 may be an inactive surface. As illustrated in FIG. 12, a thermal interface material layer 330 is disposed between the upper surface of the semiconductor chip 250 and the second lower pad 142, thereby effectively discharging heat generated in the semiconductor chip 250 through the metal plate 110.

As set forth above, according to example embodiments, a wiring board having enhanced heat dissipation is provided. The wiring board may be used as a wiring board of a module for a high heat source electronic device such as a high power light source (e.g., VCSEL). The wiring board may be advantageously used as an upper wiring board of a package-on-package type (PoP) electronic module requiring high heat dissipation.

While example embodiments have been illustrated and described above, it will be apparent to those skilled in the art that modifications and variations could be made without departing from the scope of the present disclosure as defined by the appended claims.

What is claimed is:

1. A wiring board comprising:
   a metal plate having first and second surfaces opposite to each other, and having at least one through-hole penetrating through the first and second surfaces;
   at least one conductive via respectively disposed in the at least one through-hole and spaced apart from the metal plate;
   an insulating structure comprising at least one through-insulating portion disposed between the at least one through-hole and the conductive via, and a first insulating layer and a second insulating layer extending from the at least one through-insulating portion and disposed in a first region of the first surface of the metal plate, on the first surface and the second surface, respectively, wherein the first insulating layer comprises an upper surface substantially coplanar with a surface of a second region of the first surface where the insulating structure is not formed;
   at least one first upper pad disposed on the first insulating layer and electrically connected to the conductive via;
   at least one first lower pad disposed on the second insulating layer and electrically connected to the conductive via;
   a second upper pad disposed on the first surface of the metal plate; and
   a second lower pad disposed on the second surface of the metal plate and electrically connected to the second upper pad through the metal plate.

2. The wiring board of claim 1, further comprising a conductive bonding layer formed on the second upper pad to be connected to a lower surface of an electronic device.

3. The wiring board of claim 1, wherein all side surfaces of the wiring board are provided by side surfaces of the metal plate.

4. The wiring board of claim 1, wherein the at least one through-hole comprises a plurality of through-holes, and the conductive via comprises a plurality of conductive vias disposed in the plurality of through-holes, respectively.

5. The wiring board of claim 1, wherein the at least one first upper pad and the at least one first lower pad comprise a plurality of first upper pads and a plurality of first lower pads connected to each other, respectively, by the conductive vias.

6. The wiring board of claim 1, wherein the first region has a lower level than the second region.

7. The wiring board of claim 1, wherein the second insulating layer has an upper surface substantially coplanar with a surface of the second region of the second surface where the insulating structure is not formed.

8. The wiring board of claim 1, wherein a portion of the second upper pad is disposed on the first insulating layer.

9. The wiring board of claim 1, wherein a portion of the second lower pad is disposed on the second insulating layer.

10. The wiring board of claim 1, wherein the at least one first upper pad, the at least one first lower pad, the second upper pad, and the second lower pad each comprise a plating layer.

11. The wiring board of claim 1, further comprising:
a first electronic device mounted on the second upper pad and electrically connected to the first and second upper pads, respectively.

12. The wiring board of claim 11, further comprising a second electronic device disposed on the at least one first upper pad and electrically connected to the first electronic device.

13. The wiring board of claim 11, wherein the at least one through-hole comprises a plurality of through-holes, and the conductive via comprises a plurality of conductive vias disposed in the plurality of through-holes, respectively,
wherein the at least one through-insulating portion comprises a plurality of through-insulating portions disposed between the plurality of through-holes and the conductive vias, respectively, and the first insulating layer and the second insulating layer extend from the plurality of through-insulating portions and disposed in the first region around the conductive vias, on the first surface and the second surface, respectively,
wherein the at least one first upper pad comprises a plurality of first upper pads disposed on the first insulating layer and electrically connected to the conductive vias, respectively, and
wherein the at least one first lower pad comprises a plurality of first lower pads disposed on the second insulating layer and electrically connected to the conductive vias, respectively, and
further comprising a second electronic device mounted on the at least one first upper pad and electrically connected to the first and second upper pads.

14. The wiring board of claim 1, wherein the first insulating layer extends from an upper surface of the at least one through-insulating portion such that the upper surface of the first insulating layer is substantially coplanar with the upper surface of the at least one through-insulating portion in the first region.

15. An electronic device module comprising:
a lower package having a semiconductor chip; and
an upper package comprising a wiring board disposed on the lower package, and first and second electronic devices disposed on the wiring board,
wherein the lower package comprises:
a package substrate having a wiring circuit and provided with the semiconductor chip mounted thereon to be connected to the wiring circuit;
a frame having a receiving portion accommodating the semiconductor chip; and
a plurality of vertical connection conductors penetrating through an upper surface and a lower surface of the frame and electrically connected to the wiring circuit,
wherein the wiring board of the upper package comprises:
a metal plate having a first surface facing the upper surface of the frame and a second surface opposite to the first surface, and having a plurality of through-holes penetrating through the first surface and the second surface;
a plurality of conductive vias disposed in the plurality of through-holes, respectively, and spaced apart from the metal plate;
an insulating structure comprising a plurality of through-insulating portions disposed between the plurality of through-holes and the conductive vias, respectively, and a first insulating layer and a second insulating layer extending from the plurality of through-insulating portions and disposed in first regions around the conductive vias on the first and second surfaces, respectively;
a plurality of first upper pads and a plurality of first lower pads disposed on the first and second insulating layers, respectively, and electrically connected to the conductive vias, respectively; and
a second upper pad and a second lower pad disposed on the first and second surfaces of the metal plate, respectively, and electrically connected to each other through the metal plate, and
wherein the first and second electronic devices are mounted on at least one of the first upper pads and the second upper pad, respectively, and are electrically connected to the first upper pads and the second upper pad, and the at least one first lower pads and the second lower pad are electrically connected to the plurality of vertical connection conductors, respectively.

16. The electronic device module of claim 15, wherein the semiconductor chip comprises a driving integrated circuit (IC) chip, and
wherein the first electronic device comprises a laser diode chip or a semiconductor light emitting diode chip, and the second electronic device comprises a photo diode chip.

17. The electronic device module of claim 16, wherein the driving IC chip is bonded to the package substrate in a flip-chip manner, and an upper surface of the driving IC chip is an inactive surface.

18. The electronic device module of claim 17, wherein a thermal interface material layer disposed between the upper surface of the driving IC chip and the second lower pad is provided.

19. The electronic device module of claim 15, wherein the upper package further comprises a lens housing disposed on the wiring board and having a window open upwardly, and a lens unit disposed in the window of the lens housing.

20. A wiring board comprising:
a metal plate having first and second surfaces opposite to each other, each of the first and second surfaces being divided into first and second regions, wherein the first region has a lower level than the second region, and the metal plate comprises at least one through-hole penetrating through the first region of the first and second surfaces;
an insulating structure comprising at least one through-insulating portion disposed along a sidewall of the at least one through-hole, a first insulating layer extending from the at least one through-insulating portion to an end of the first region of the first surface such that an upper surface of the first insulating layer is substantially coplanar with the first surface of the metal plate in the second region, and a second insulating layer extending from the at least one through-insulating portion to the first region of the second surface;

at least one conductive via penetrating through the insulating structure to be located in the at least one through-hole and electrically insulated from the metal plate by the at least one through-insulating portion;

at least one first upper pad and at least one first lower pad disposed on the first insulating layer and the second insulating layer, respectively, and electrically connected to each other by the conductive via; and a second upper pad and a second lower pad disposed on the second region of the first surface and the second region of the second surface, respectively, and electrically connected to each other through the metal plate.

* * * * *